United States Patent [19]
Okada

[11] Patent Number: 5,909,146
[45] Date of Patent: Jun. 1, 1999

[54] OPERATIONAL AMPLIFIER HAVING RAIL TO RAIL INPUT/OUTPUT ABILITY

[75] Inventor: Kouji Okada, Kasugai, Japan

[73] Assignee: Fujitsu Limited, Kanagawa, Japan

[21] Appl. No.: 08/869,743

[22] Filed: Jun. 5, 1997

[30] Foreign Application Priority Data

Aug. 29, 1996 [JP] Japan ................................ 8-228605

[51] Int. Cl.$^6$ ...................................................... H03F 3/45
[52] U.S. Cl. ........................................................... 330/255
[58] Field of Search .................................. 330/253, 255, 330/257, 260, 261

[56] References Cited

U.S. PATENT DOCUMENTS

| | | | |
|---|---|---|---|
| 5,621,357 | 4/1997 | Botti et al. ............................ | 330/260 X |
| 5,670,910 | 9/1997 | Kato ...................................... | 330/255 X |

FOREIGN PATENT DOCUMENTS

| | | | |
|---|---|---|---|
| 0 028 932 | 5/1981 | European Pat. Off. . | |
| 0 259 879 | 3/1988 | European Pat. Off. . | |
| 0 535 951 | 4/1993 | European Pat. Off. . | |
| 0230206 | 10/1987 | Japan ...................................... | 330/255 |
| 2-92008 | 3/1990 | Japan . | |

OTHER PUBLICATIONS

Huijsing J. H. et al: "Low–Power Low–Voltage VLSI Operational Amplifier Cells", IEEE Transactions On Circuits and Systems I: Fundamental Theory and Applications, vol. 42, No. 11, Nov. 1, 1995, pp. 841–852.

Patent Abstracts of Japan, vol. 004, No. 079, Jun. 7, 1980 & JP 55 045215A, Toshiba Corp., Mar. 29, 1980.

T. Giesberts: "Hexfet Amplifier Upgrade" Elektor Electronics, vol. 21, No. 236, Sep. 1, 1995, pp. 14–19.

*Primary Examiner*—Steven Mottola
*Attorney, Agent, or Firm*—Nikaido Marmelstein Murray & Oram, LLP

[57] ABSTRACT

An operational amplifier having a high voltage power supply and a low voltage power supply receives first and second input signals and amplifies a voltage difference between the first and second input signals to generate an amplified signal. The operational amplifier has a first differential amplifier having a pair of first type transistors that are activated by the first and second input signals having a voltage greater than the voltage of the low voltage power supply. The first differential amplifier transmits a first output signal (S1) in response to the voltage difference between the first and second input signals. A second differential amplifier has a pair of second type transistors that are activated by the first and second input signals having a voltage smaller than the voltage of the high voltage power supply. The second differential amplifier transmits a second output signal (S2) in response to the voltage difference between the first and the second input signals. An output circuit synthesizes the first and second output signals. The output circuit is activated by a synthesized signal to transmit the amplified signal.

11 Claims, 7 Drawing Sheets

«5,909,146»

OPERATIONAL AMPLIFIER HAVING RAIL TO RAIL INPUT/OUTPUT ABILITY

BACKGROUND OF THE INVENTION

The present invention relates to an operational amplifier circuit.

In recent electronic circuit design, there has been a demand for a lower supply voltage to reduce power consumption and noise. Designing an operational amplifier for such an electronic circuit to operate on a lower supply voltage inevitably results in a narrower input voltage range. In this respect, there is a demand for an operational amplifier capable of widening the input voltage range from the voltage of a high-potential power supply to the voltage of a low-potential power supply.

FIG. 1 shows a conventional operational amplifier 50. This operational amplifier 50, which is a voltage follower type, has an output terminal connected to an inverting input terminal (negative input terminal) to which an output signal OUT0 is applied as an input signal IN12. A high-potential supply voltage $V_{CC}$ (5 V) and a low-potential supply voltage $V_{SS}$ (0 V) are supplied to the operational amplifier 50 as its operational supply voltages.

FIG. 2 illustrates the practical internal circuit of the conventional operational amplifier 50. The operational amplifier 50 comprises a differential amplifier 51 with an MOS transistor structure and an inverting amplifier 53, which is comprised of complementary transistors. The differential amplifier 51 has two nMOS transistors T21 and T22, two pMOS transistors T23 and T24, and a constant current source 52.

The pMOS transistors T23 and T24 have their sources connected to the high-potential power supply $V_{CC}$ (5 V) and their gates connected to the drain of the pMOS transistor T24. The pMOS transistors T23 and T24 form a current mirror circuit.

The drains of the nMOS transistors T21 and T22 are respectively connected to the drains of the pMOS transistors T23 and T24. The sources of the nMOS transistors T21 and T22 are connected together to the low-potential power supply $V_{SS}$ (0 V) via the constant current source 52. The gate of the nMOS transistor T21 corresponds to a non-inverting input terminal to which an input signal IN11 is input. The gate of the nMOS transistor T22 corresponds to an inverting input terminal to which the output signal OUT0 is supplied as the input signal IN12.

The differential amplifier 51 outputs a signal, which is the inverted signal of the potential difference between the first input signal IN11 and the second input signal IN12, from the drain of the nMOS transistor T21. When the potential of the input signal IN11 is higher than that of the input signal IN12, more current flows in the nMOS transistor T21 and less current flows in the nMOS transistor T22. As a result, the potential of the output signal of the differential amplifier 51 drops. When the potential of the input signal IN11 is lower than that of the input signal IN12, on the other hand, less current flows in the nMOS transistor T21 and more current flows in the nMOS transistor T22. Consequently, the potential of the output signal of the differential amplifier 51 is higher than that when the potential of the input signal IN11 is higher than that of the input signal IN12.

The high-potential supply voltage $V_{CC}$ (5 V) and the low-potential supply voltage $V_{SS}$ (0 V) are supplied to the inverting amplifier 53 as its operational supply voltages. The inverting amplifier 53 amplifies the output signal of the differential amplifier 51 in accordance with its amplification factor (A) and sends out the resultant signal as the output signal OUT0.

In the operational amplifier in FIG. 2, the threshold voltages Vth of the nMOS transistors T21 and T22 are each 1 V, and the voltage drop in the constant current source 52 is 0 V. The gate-source voltage $V_{GS}$ of the nMOS transistor T21 is 0.5 V. When 4.5 V, which is slightly lower than the high-potential supply voltage, is applied as the input signal IN11, for example, the nMOS transistors T21 and T22 are turned on, and the differential amplifier 51 operates properly causing 4.5 V to be output as the output signal OUT0.

When 0.5 V, which is slightly higher than the low-potential supply voltage, is applied as the input signal IN11, on the other hand, the nMOS transistors T21 and T22 are turned off because the input voltage is lower than the threshold voltage Vth. As a result, the differential amplifier 51 does not properly operate, so that 0.5 V cannot be output as the output signal OUT0. The operational amplifier in FIG. 2 cannot therefore widen the voltage range of the input signals IN11 and IN12 to substantially the same range as that of the supply voltages.

FIG. 3 illustrates another example of a conventional operational amplifier 50, which is constituted by MOS transistors. This operational amplifier 50 comprises a differential amplifier 55 and the same inverting amplifier 53 as used in the previously discussed operational amplifier. The differential amplifier 51 has two nMOS transistors T25 and T26, two pMOS transistors T27 and T28, and a constant current source 56.

The nMOS transistors T25 and T26 have their sources connected to the low-potential power supply $V_{SS}$ (0 V) and their gates connected to the drain of the nMOS transistor T26. The nMOS transistors T25 and T26 form a current mirror circuit.

The drains of the pMOS transistors T27 and T28 are connected to the drains of the nMOS transistors T25 and T26, respectively. The sources of the pMOS transistors T27 and T28 are connected together to the high-potential power supply $V_{CC}$ (5 V) via the constant current source 56. The gate of the pMOS transistor T27 corresponds to a non-inverting input terminal to which an input signal IN11 is input. The gate of the pMOS transistor T28 corresponds to an inverting input terminal to which the output signal OUT0 is supplied as the input signal IN12.

The differential amplifier 55 outputs a signal, which is the inverted signal of the potential difference between the first input signal IN11 and the second input signal IN12, from the drain of the pMOS transistor T27. When the potential of the input signal IN11 is higher than that of the input signal IN12, less current flows in the pMOS transistor T27 and more current flows in the pMOS transistor T28. As a result, the potential of the output signal of the differential amplifier 55 drops. When the potential of the input signal IN11 is lower than that of the input signal IN12, on the other hand, more current flows in the pMOS transistor T27 and less current flows in the pMOS transistor T28. Consequently, the potential of the output signal of the differential amplifier 55 is higher than that when the potential of the input signal IN11 is higher than that of the input signal IN12.

In the operational amplifier in FIG. 3, the threshold voltages Vth of the pMOS transistors T27 and T28 are each −1 V, and the voltage drop in the constant current source 56 is 0 V. When 0.5 V, which is higher than the low-potential supply voltage, is applied as the input signal IN11, for example, the pMOS transistors T27 and T28 are turned on, and the differential amplifier 55 operates properly causing 0.5 V to be output as the output signal OUT0.

When 4.5 V is applied as the input signal IN11, on the other hand, the pMOS transistors T27 and T28 are turned off because the input voltage is greater than the difference (4 V) between the absolute value of the high-potential supply voltage and the absolute value of the threshold voltage Vth. As a result, the differential amplifier 55 does not properly operate, so that 4.5 V cannot be output as the output signal OUT0. Therefore, the operational amplifier in FIG. 3 cannot widen the voltage range of the input signals IN11 and IN12 to substantially the same range as that of the supply voltages.

FIG. 4 shows another example of the prior art where the operational amplifier 50 in FIG. 1 is constituted of bipolar transistors. This operational amplifier 50 comprises a differential amplifier 60 and the same inverting amplifier 53 as discussed above. The differential amplifier 60 has two npn transistors Q21 and Q22, two pnp transistors Q23 and Q24, and a constant current source 61.

The pnp transistors Q23 and Q24 have their emitters connected to the high-potential power supply $V_{CC}$ (5 V) and their bases connected to the collector of the pnp transistor Q24. The pnp transistors Q23 and Q24 form a current mirror circuit.

The collectors of the npn transistors Q21 and Q22 are connected to the collectors of the pnp transistors Q23 and Q24, respectively. The emitters of the npn transistors Q21 and Q22 are connected together to the low-potential power supply $V_{SS}$ (0 V) via the constant current source 61. The base of the npn transistor Q21 corresponds to a non-inverting input terminal to which an input signal IN11 is input. The base of the npn transistor Q22 corresponds to an inverting input terminal to which the output signal OUT0 is supplied as the input signal IN12.

The differential amplifier 60 outputs a signal, which is the inverted signal of the potential difference between the first input signal IN11 and the second input signal IN12, from the collector of the npn transistor Q21. When the potential of the input signal IN11 is higher than that of the input signal IN12, more current flows in the npn transistor Q21 and less current flows in the npn transistor Q22. As a result, the potential of the output signal of the differential amplifier 60 drops. When the potential of the input signal IN11 is lower than that of the input signal IN12, on the other hand, less current flows in the npn transistor Q21 and more current flows in the npn transistor Q22. Consequently, the potential of the output signal of the differential amplifier 60 rises.

In the operational amplifier in FIG. 4, the base-emitter voltages Vbe of the npn transistors Q21 and Q22 are each 0.7 V, and the voltage drop in the constant current source 61 is 0 V. When 4.5 V is applied as the input signal IN11, for example, the npn transistors Q21 and Q22 are turned on, and the differential amplifier 60 properly operates causing 4.5 V to be output as the output signal OUT0.

When 0.5 V, which is greater than the low-potential supply voltage, is applied as the input signal IN11, on the other hand, the npn transistors Q21 and Q22 are turned off because the input voltage is lower than the base-emitter voltage Vbe. As a result, the differential amplifier 60 does not properly operate, so that 0.5 V cannot be output as the output signal OUT0. Therefore, the operational amplifier in FIG. 4 cannot widen the voltage range of the input signals IN11 and IN12 to substantially the same range as that of the supply voltages.

In the various types of conventional operational amplifiers 50, as apparent from the above, the voltage range of the input signals IN11 and IN12 cannot be set to range from the voltage of the high-potential power supply to the voltage of the low-potential power supply. This prevents a reduction in the supply voltages.

Some operational amplifiers are designed to set the voltage range of the input signals IN11 and IN12 to the same range as that of the supply voltages by forming the nMOS transistors T21 and T22 of the differential amplifier 51 with depletion type field effect transistors (FETs). The depletion type FETs however suffer a complex fabrication process, which makes it difficult to design the FETs into an IC. Designing the depletion type FETs into an IC leads to a cost increase.

SUMMARY OF THE INVENTION

Accordingly, it is an objective of the present invention to provide an operational amplifier which can widen the voltage range of the input signals from the voltage of the high-potential power supply to the voltage of the low-potential power supply, and can be designed into an IC at a low cost.

To achieve the foregoing and other objects and in accordance with the purpose of the present invention, there is provided an operational amplifier having a high voltage power supply and a low voltage power supply. The operational amplifier receives first and second input signals and amplifies a voltage difference between the first and second input signals to generate an amplified signal. The operational amplifier has a first differential amplifier having a pair of first type transistors that are activated by the first and second input signals having a voltage greater than the voltage of the low voltage power supply. The first differential amplifier transmits a first output signal (S1) in response to the voltage difference between the first and second input signals. A second differential amplifier has a pair of second type transistors that are activated by the first and second input signals having a voltage smaller than the voltage of the high voltage power supply. The second differential amplifier transmits a second output signal (S2) in response to the voltage difference between the first and the second input signals. An output circuit synthesizes the first and second output signals. The output circuit is activated by a synthesized signal to transmit the amplified signal.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
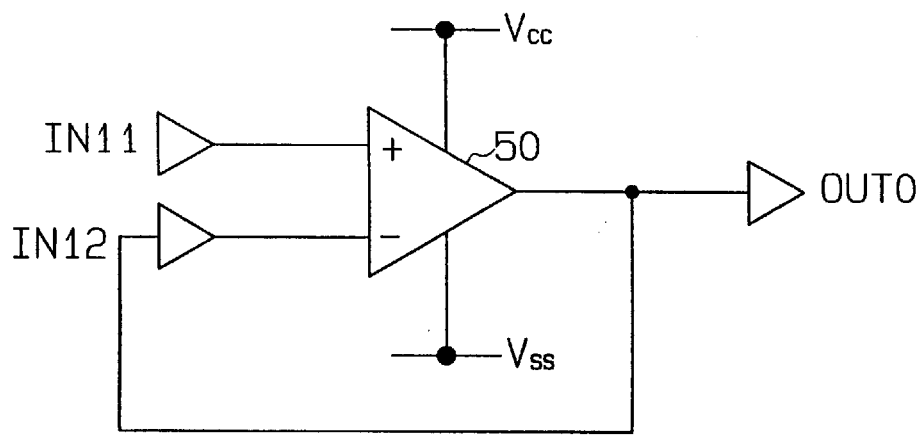
FIG. 1 is a circuit diagram of a conventional operational amplifier.
Figure 2:
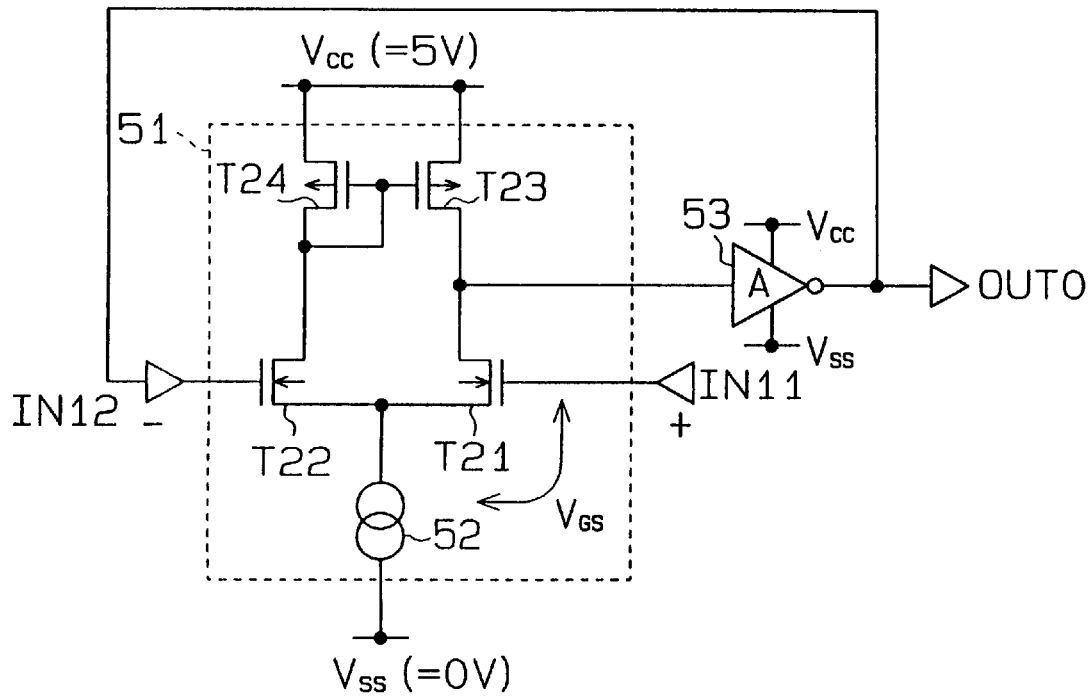
FIG. 2 is a detailed circuit diagram of the conventional operational amplifier.
Figure 3:
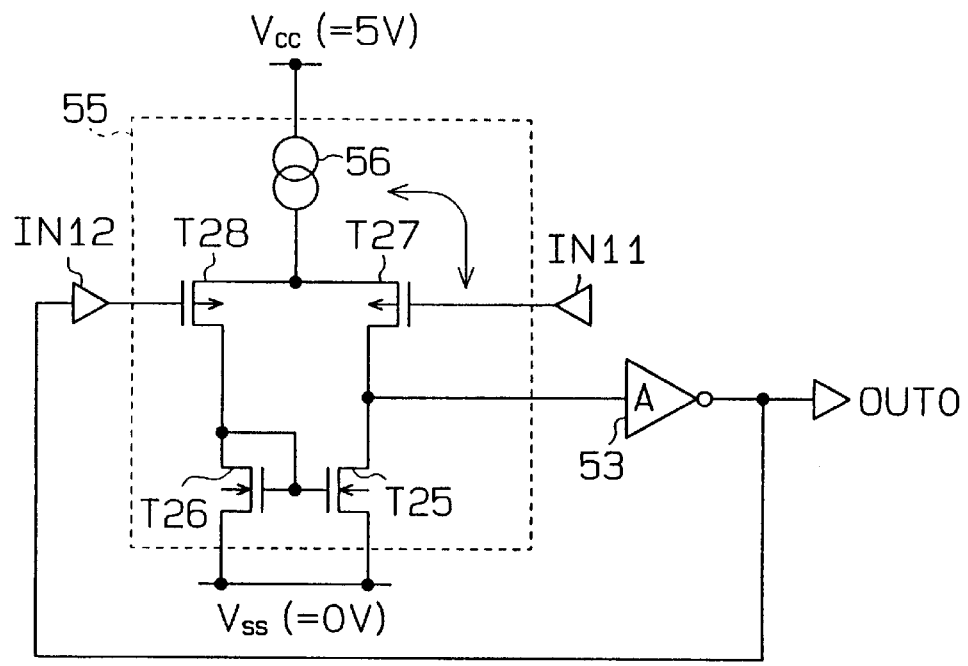
FIG. 3 is a circuit diagram showing another conventional operational amplifier.
Figure 4:
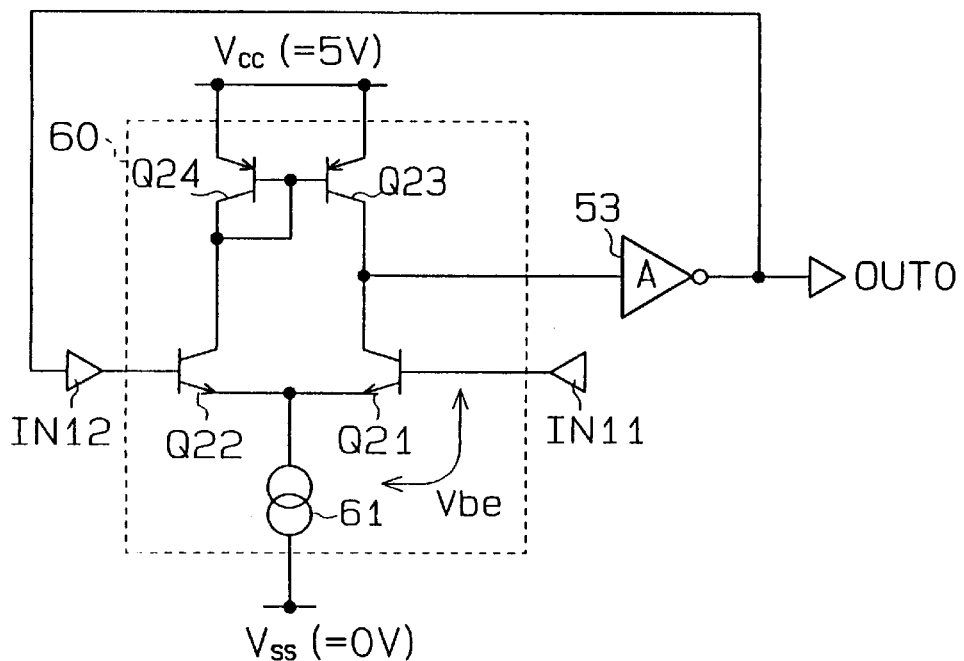
FIG. 4 is a circuit diagram depicting a further conventional operational amplifier.
Figure 5:
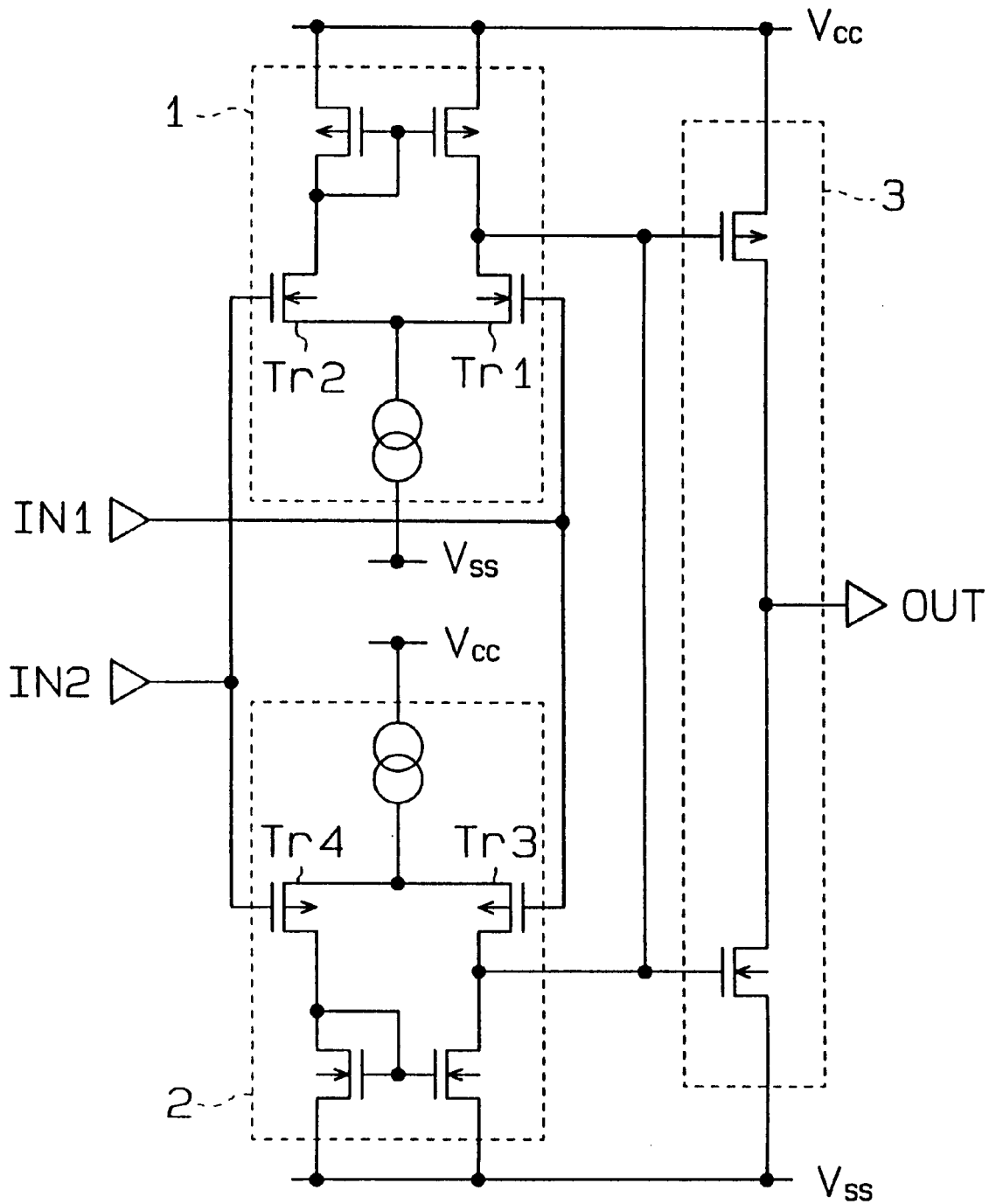
FIG. 5 is a circuit diagram schematically illustrating an operational amplifier embodying this invention.

Referring to FIG. 5, an operational amplifier comprises a first differential amplifier 1, a second differential amplifier 2 and an output circuit 3. A high-potential supply voltage $V_{CC}$ and a low-potential supply voltage $V_{SS}$ are supplied as operational supply voltages to the first differential amplifier 1. The first differential amplifier 1 has a first differential pair of transistors Tr1 and Tr2 of a first type, which operate based on first and second input signals IN1 and IN2 having higher potentials than the low-potential supply voltage $V_{SS}$. The first differential amplifier 1 sends out a first signal based on the potential difference between the first and second input signals IN1 and IN2.

The high-potential supply voltage $V_{CC}$ and the low-potential supply voltage $V_{SS}$ are likewise supplied as operational supply voltages to the second differential amplifier 2. The second differential amplifier 2 has a second differential pair of transistors Tr3 and Tr4 of a second type, which operate based on the first and second input signals IN1 and IN2 having lower potentials than the high-potential supply voltage $V_{CC}$. The second differential amplifier 2 sends out a second signal based on the potential difference between the first and second input signals IN1 and IN2. The output circuit 3 operates based on a signal, which is obtained by combining the first and second signals, and outputs an amplified signal OUT.

In the operational amplifier in FIG. 5, when the potential of the input signal IN1 or IN2 is very close to the low-potential supply voltage $V_{SS}$, the first differential amplifier 1, which is comprised of the first type of transistors Tr1 and Tr2, does not operate, while the second differential amplifier 2, which is comprised of the second type of transistors Tr3 and Tr4, properly operates based on the input signal IN1 or In2 and outputs a signal of a predetermined potential. Based on this output signal, therefore, the output circuit 3 operates to output the amplified signal OUT.

When the potential of the input signal IN1 or IN2 is very close to the high-potential supply voltage $V_{CC}$, the second differential amplifier 2, which is comprised of the second type of transistors Tr3 and Tr4, does not operate, while the first differential amplifier 1, which is comprised of the first type of transistors Tr1 and Tr2, properly operates based on the input signal IN1 or IN2 and outputs a signal of a predetermined potential. Based on this output signal, therefore, the output circuit 3 operates to output the amplified signal OUT. The voltage of the input signal IN1 or IN2 can range from substantially the voltage of the high-potential power supply $V_{CC}$ to substantially the voltage of the low-potential power supply $V_{SS}$.

Figure 6:
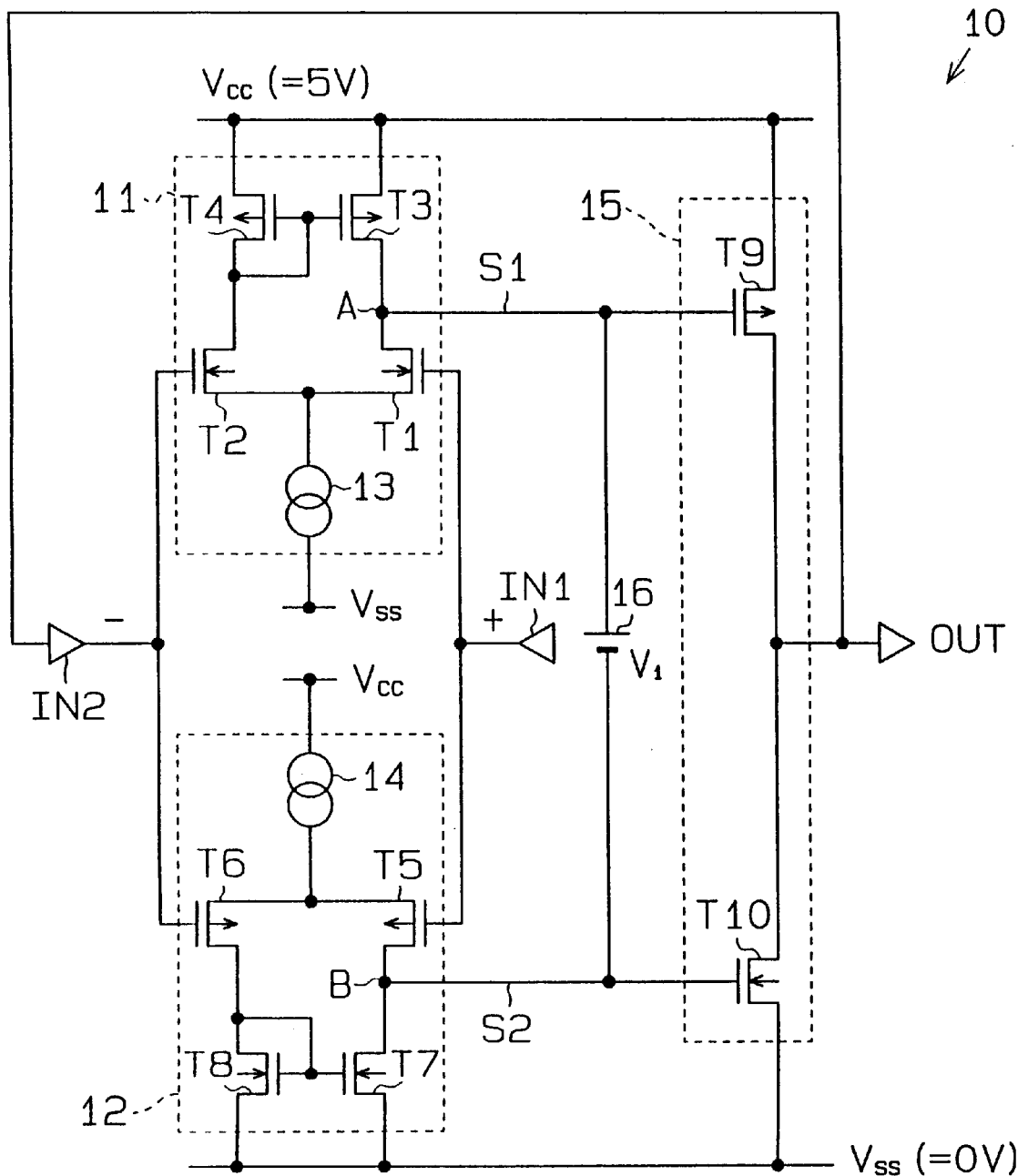
FIG. 6 is a circuit diagram of an operational amplifier according to the first embodiment.

The first embodiment of this invention will now be discussed with reference to FIG. 6. An operational amplifier 10 shown in FIG. 6 is a voltage follower type, and has its output terminal connected to its inverting input terminal (negative input terminal) to which an output signal OUT is applied as the input signal IN2. This operational amplifier 10 is comprised of enhancement type MOS transistors and comprises first and second differential amplifiers 11 and 12, an inverting amplifier 15 as the output circuit and a battery or a power supply 16 as a level-shifting power supply circuit.

The first differential amplifier 11 has two nMOS transistors T1 and T2, two pMOS transistors T3 and T4, and a constant current source 13. The pMOS transistors T3 and T4 have their sources connected to the high-potential power supply $V_{CC}$ (5 V) and their gates connected to the drain of the pMOS transistor T4. The pMOS transistors T3 and T4 form a current mirror circuit.

The drains of the nMOS transistors T1 and T2 are connected to the drains of the pMOS transistors T3 and T4, respectively. The sources of the nMOS transistors T1 and T2 are connected together to the low-potential power supply $V_{SS}$ (0 V) via the constant current source 13. The gate of the nMOS transistor T1 corresponds to a non-inverting input terminal to which the input signal IN1 is input. The gate of the nMOS transistor T2 corresponds to an inverting input terminal to which the output signal OUT is supplied as the input signal IN2.

The first differential amplifier 11 outputs a signal S1, which is the inverted signal of the potential difference between the first input signal IN1 and the second input signal IN2, from the drain of the nMOS transistor T1. When the potential of the input signal IN1 is higher than that of the input signal IN2, more current flows in the nMOS transistor T1 and less current flows in the nMOS transistor T2. As a result, the potential of the output signal S1 of the differential amplifier 11 drops. When the potential of the input signal IN1 is lower than that of the input signal IN2, on the other hand, less current flows in the nMOS transistor T1 and more current flows in the nMOS transistor T2. Consequently, the potential of the output signal S1 of the differential amplifier 11 rises higher than that where the potential of the input signal IN1 is higher than that of the input signal IN2.

The second differential amplifier 12 has two pMOS transistors T5 and T6, two nMOS transistors T7 and T8, and a constant current source 14. The nMOS transistors T7 and T8 have their sources connected to the low-potential power supply $V_{SS}$ (0 V) and their gates connected to the drain of the nMOS transistor T8. The nMOS transistors T7 and T8 form a current mirror circuit.

The drains of the pMOS transistors T5 and T6 are connected to the drains of the nMOS transistors T7 and T8, respectively. The sources of the pMOS transistors T5 and T6 are connected together to the high-potential power supply $V_{CC}$ (5 V) via the constant current source 14. The gate of the pMOS transistor T5 corresponds to a non-inverting input terminal to which the input signal IN1 is input. The gate of the pMOS transistor T6 corresponds to an inverting input terminal to which the output signal OUT is supplied as the input signal IN2.

The second differential amplifier 12 outputs a signal S2, which is the inverted signal of the potential difference between the first input signal IN1 and the second input signal IN2, from the drain of the pMOS transistor T5. When the potential of the input signal IN1 is higher than that of the input signal IN2, less current flows in the pMOS transistor T5 and more current flows in the pMOS transistor T6. As a result, the potential of the output signal S2 of the differential amplifier 12 drops. When the potential of the input signal IN1 is lower than that of the input signal IN2, on the other hand, more current flows in the pMOS transistor T5 and less current flows in the pMOS transistor T6. Consequently, the potential of the output signal S2 of the differential amplifier 12 rises higher than that where the potential of the input signal IN1 is higher than that of the input signal IN2.

The power supply 16 is connected between the drain of the nMOS transistor T1 of the first differential amplifier 11 and the drain of the pMOS transistor T6 of the second differential amplifier 12. The connection of the power supply 16 whose voltage is V1 (V1<$V_{CC}$-$V_{SS}$) is made in such a manner that the potential on the side of the nMOS transistor T1 becomes high and the potential on the side of the pMOS transistor T6 becomes low. Accordingly, there is a potential difference V1 between the output signals S1 and S2.

The inverting amplifier 15 has a pMOS transistor T9 and an nMOS transistor T10, which are connected in series between the high-potential power supply $V_{CC}$ (5 V) and the low-potential power supply $V_{SS}$ (0 V). The gate of the pMOS transistor T9 is supplied with the output signal S1 of the first differential amplifier 11 directly or the output signal S2 of the second differential amplifier 12 via the power supply 16. The gate of the nMOS transistor T10 is supplied with the output signal S2 of the second differential amplifier 12 directly or the output signal S1 of the first differential amplifier 11 via the power supply 16. The inverting amplifier 15 sends out the signal OUT, which is obtained by amplifying the output signal S1 or S2 of the first or second differential amplifier 11 or 12 in accordance with its amplification factor (A).

The operation of the thus constituted operational amplifier 10 will now be described. Note that the threshold voltages Vth of the nMOS transistors T1 and T2 are 1 V, and the threshold voltages Vth of the pMOS transistors T5 and T6 are −1 V. The voltage drops in the constant current sources 13 and 14 are 0 V.

When 0.5 V, slightly higher than the low-potential supply voltage, is applied as the input signal IN1, the nMOS transistors T1 and T2 are turned off because the input voltage is equal to or less than the threshold voltage Vth of the nMOS transistors T1 and T2.

At this time, however, the pMOS transistors T5 and T6 of the second differential amplifier 12 are turned on and the first differential amplifier 12 properly operates to output the output signal S2 of a predetermined potential based on the input signal IN1.

The potential of the output signal S1 is the potential of the output signal S2 plus the voltage V1 of the power supply 16. Therefore, the pMOS transistor T9 and the nMOS transistor T10 are controlled based on the potentials of the output signals S1 and S2, permitting the same voltage of 0.5 V as the potential of the input signal IN1 to be output as the output signal OUT from the inverting amplifier 15.

When a voltage ranging from 1 V to 4 V is applied as the input signal IN1, the nMOS transistors T1 and T2 are turned on, and the first differential amplifier 11 operates properly to send out the output signal S1 of a predetermined potential based on the input signal IN1. Further, the pMOS transistors T5 and T6 are turned on, and the second differential amplifier 12 also operates properly to send out the output signal S2 of a predetermined potential based on the input signal IN1. At this time, the potential difference between the output signals S1 and S2 is equal to the voltage V1 of the power supply 16. The pMOS transistor T9 and the nMOS transistor T10 are controlled based on the potentials of the output signals S1 and S2, so that the same voltage as the potential of the input signal IN1 can be sent out as the output signal OUT from the inverting amplifier 15.

When 4.5 V is applied as the input signal IN1, the pMOS transistors T5 and T6 are turned off because the input voltage is greater than the difference (4 V) between the absolute value (5 V) of the high-potential supply voltage and the absolute value of the threshold voltage Vth (−1 V) of the pMOS transistors T5 and T6.

At this time, however, the nMOS transistors T1 and T2 of the first differential amplifier 11 are turned on and the first differential amplifier 11 properly operates to output the output signal S1 of a predetermined potential based on the input signal IN1.

The potential of the output signal S2 is therefore the voltage V1 of the power supply 16 subtracted from the potential of the output signal S1. Based on the potentials of the output signals S1 and S2, the pMOS transistor T9 and the nMOS transistor T10 are controlled to permit the same voltage of 4.5 V as the potential of the input signal IN1 to be output as the output signal OUT from the inverting amplifier 15. According to this embodiment, as apparent from the above, the operational amplifier can reliably be operated in accordance with the input signals whose potentials lie in a wide voltage range from 0.5 V, which is close to the low-potential supply voltage, to 4.5 V, which is close to the high-potential supply voltage.

In short, the operational amplifier of this embodiment operates as follows and has the following advantages.

The embodiment of FIG. 6 is provided with the first differential amplifier 11 having the nMOS transistors T1 and T2 and the second differential amplifier 12 having the pMOS transistors T5 and T6, so that the signal OUT can be output from the inverting amplifier 15 based on the output signal of one of those differential amplifiers. Even when the potential of the input signal IN1 is equal to or lower than the threshold voltage Vth of the nMOS transistors T1 and T2, so that the first differential amplifier 11 does not operate, the second differential amplifier 12 operates properly. Even when the potential of the input signal IN1 is greater than the difference between the absolute value of the high-potential supply voltage and the absolute value of the threshold voltage Vth of the pMOS transistors T5 and T6, so that the second differential amplifier 12 does not operate, the first differential amplifier 11 operates properly. It is therefore possible to widen the voltage range of the input signal IN1 to be substantially equal to the range from the voltage of the high-potential power supply $V_{CC}$ to the voltage of the low-potential power supply $V_{SS}$.

Further, there is a variation in the threshold voltage Vth of MOS transistors, which depends on the fabrication process. However, the provision of the first and second differential amplifiers 11 and 12 in this embodiment eliminates the influence of the variation in the threshold voltage Vth of MOS transistors.

According to this embodiment, the inverting amplifier 15 is comprised of the pMOS transistor T9 connected to the high-potential power supply $V_{SS}$ and the nMOS transistor T10 connected to the low-potential power supply $V_{CC}$. It is therefore possible to widen the voltage range of the output signal OUT to be substantially equal to the range from the high-potential supply voltage to the voltage of the low-potential supply voltage.

According to this embodiment, a predetermined potential difference is given between the output signals S1 and S2 by connecting the power supply circuit 16 as a level-shifting power supply circuit between the output signal S1 of the first differential amplifier 11 and the output signal S2 of the second differential amplifier 12. This improves the linearity of the outputs of the pMOS transistor T9 and the nMOS transistor T10 of the inverting amplifier 15.

The second embodiment of this invention will now be discussed with reference to FIG. 7. To avoid a redundant description, like or same reference numerals are given to those components that are like or the same as the corresponding components in FIG. 6 described above. The differences between the operational amplifier of FIG. 7 and the above-described amplifier 10 of FIG. 6 will be mainly explained.

Figure 7:
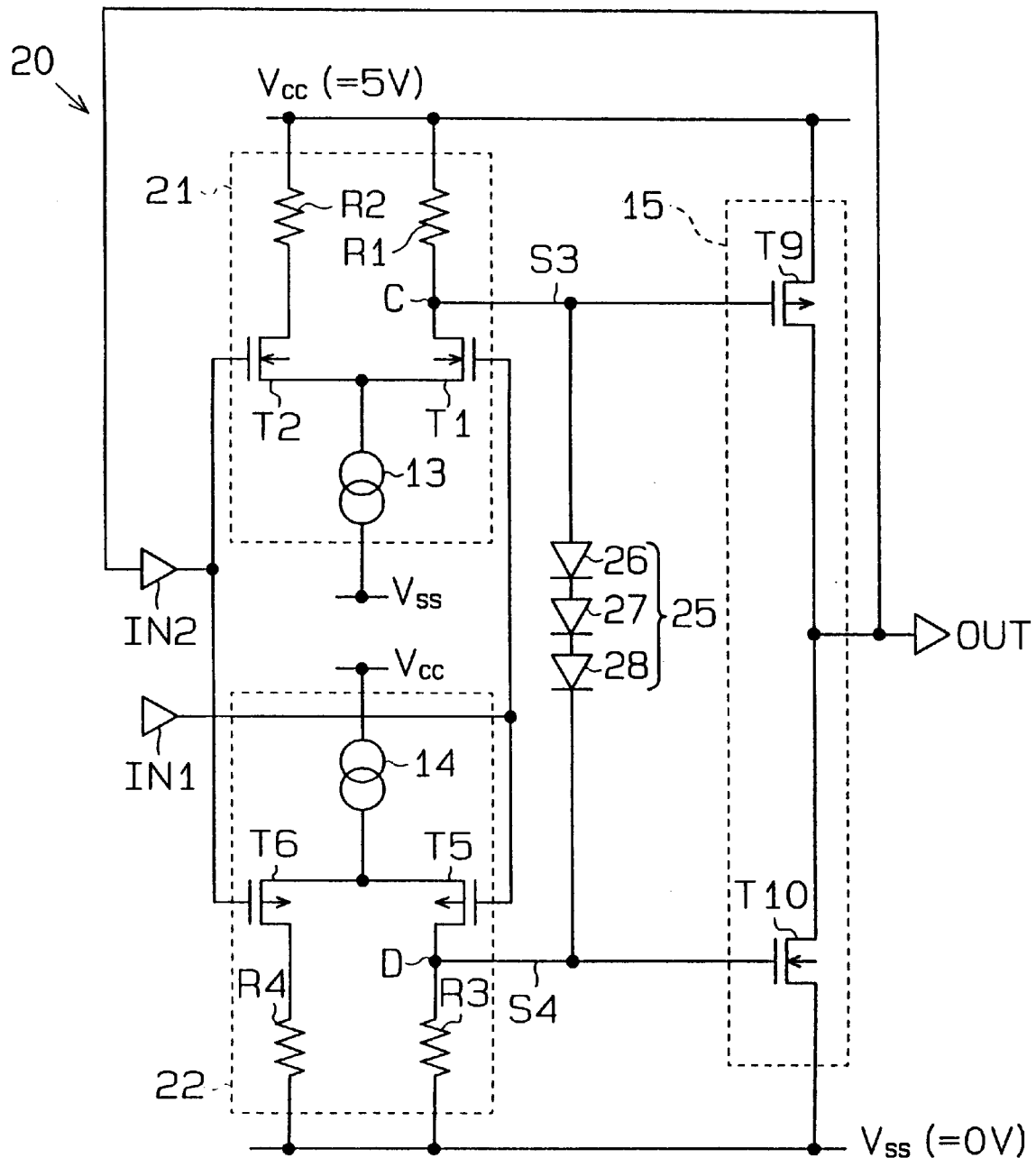
FIG. 7 is a circuit diagram of an operational amplifier according to the second embodiment.

An operational amplifier 20 in FIG. 7, like the one in FIG. 6, is a voltage follower type constituted of enhancement type MOS transistors. This operational amplifier 20 comprises first and second differential amplifiers 21 and 22, an inverting amplifier 15 and a level-shifting power supply circuit 25.

The structure of the first differential amplifier 21 differs from that of the above-mentioned first differential amplifier 11 only in that resistors R1 and R2 are used in place of the pMOS transistors T3 and T4. The first differential amplifier 21 outputs a signal S3 based on the input signals IN1 and IN2 from the drain of the nMOS transistor T1.

The structure of the second differential amplifier 22 of FIG. 7 differs from that of the second differential amplifier 12 of FIG. 6 only in that resistors R3 and R4 are used in place of the nMOS transistors T7 and T8. The second differential amplifier 22 outputs a signal S4 based on the input signals IN1 and IN2 from the drain of the pMOS transistor T5.

The level-shifting power supply circuit 25 includes the resistors R1 and R3 and a plurality of (three in this embodiment) diodes 26 to 28 connected in series between both resistors R1 and R3. The level-shifting power supply circuit 25 is connected between the drain of the nMOS transistor T1 of the first differential amplifier 21 and the drain of the pMOS transistor T6 of the second differential amplifier 22. The series circuit of the diodes 26–28 is connected to the nMOS transistor T1 on its anode side and is connected to the pMOS transistor T5 on its cathode side. Therefore, a potential difference equivalent to the total of the ON voltages of the three diodes is given between the output signals S1 and S2.

The operational amplifier 20 of this embodiment operates in the same way as the above-described operational amplifier 10 and has the same advantages as the operational amplifier 10. Since the level-shifting power supply circuit 25 is comprised of the resistors R1 and R3 and the diodes 26–28 connected in series between both resistors R1 and R3, the potential difference between the output signals S1 and S2 is easily produced without using a power supply.

The third embodiment of this invention will now be discussed with reference to FIG. 8. To avoid a redundant description, like or same reference numerals are given to those components that are like or the same as the corresponding components in FIG. 6 described above. The differences between an operational amplifier of FIG. 8 and the above-described operational amplifier 10 of FIG. 6 will be mainly explained.

Figure 8:
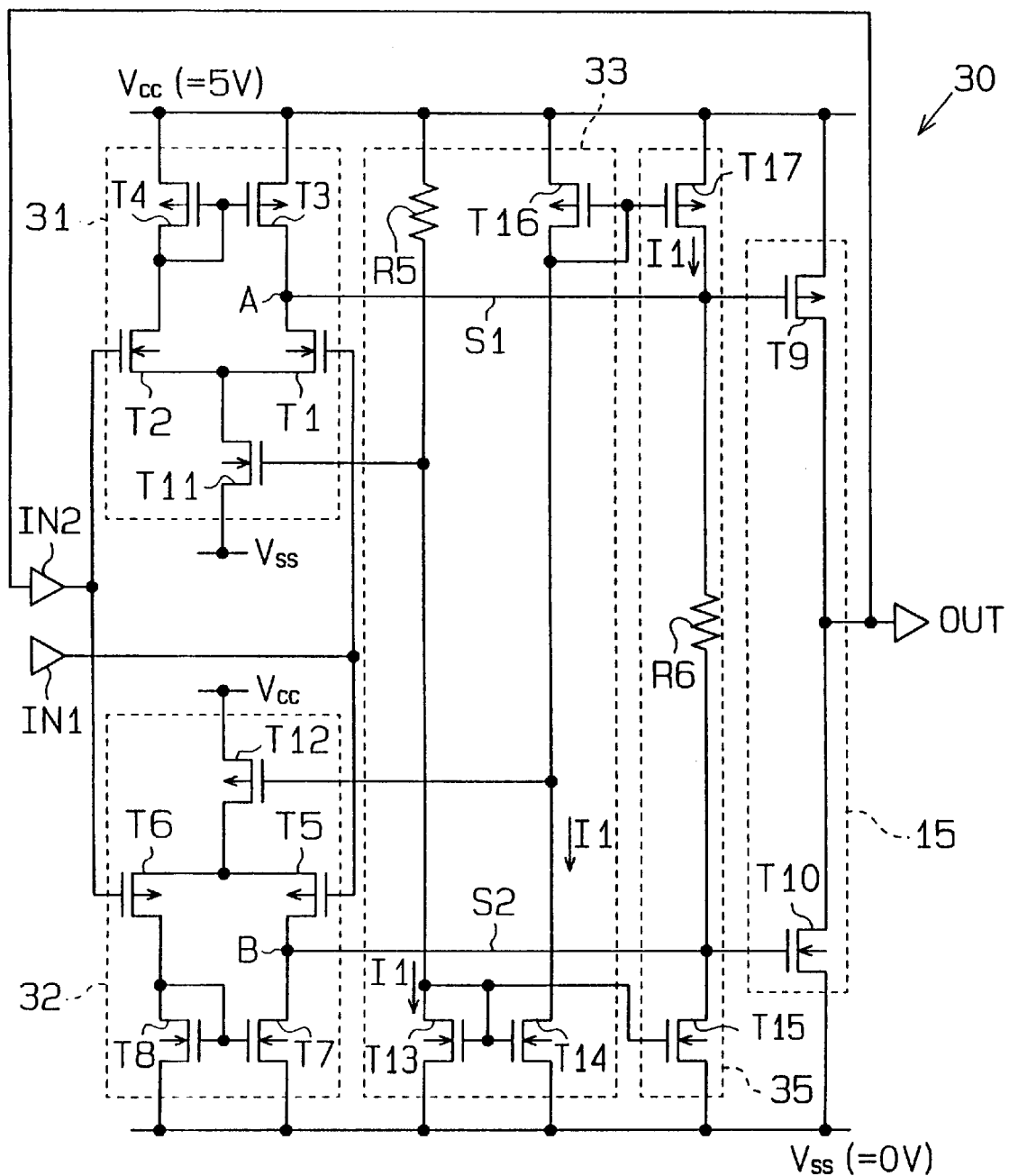
FIG. 8 is a circuit diagram of an operational amplifier according to the third embodiment.

An operational amplifier 30 in FIG. 8 is constituted of enhancement type MOS transistors and comprises first and second differential amplifiers 31 and 32, an inverting amplifier 15, a constant current circuit 33 and a level-shifting power supply circuit 35.

The structure of the first differential amplifier 31 differs from that of the first differential amplifier 11 only in that an nMOS transistor T11 is used as the aforementioned constant current source 13. The first differential amplifier 31 outputs a signal S1 based on the input signals IN1 and IN2 from the drain of the nMOS transistor T1.

The structure of the second differential amplifier 32 differs from that of the second differential amplifier 12 only in that a pMOS transistor T12 is used as the aforementioned constant current source 14. The second differential amplifier 32 outputs a signal S2 based on the input signals IN1 and IN2 from the drain of the pMOS transistor T5.

The constant current circuit 33 has a resistor R5, nMOS transistors T13 and T14 and a pMOS transistor T16. The nMOS transistor T13 has a drain connected via the resistor R5 to the high-potential power supply $V_{CC}$ and a source connected to the low-potential power supply $V_{SS}$. The gate of the nMOS transistor T13 is connected to the gate of the nMOS transistor T11. The nMOS transistor T14 has a source connected to the low-potential power supply $V_{SS}$ and a gate connected to the gate of the nMOS transistor T13. Therefore, the nMOS transistors T11, T13 and T14 form a current mirror circuit and a constant current I1 flows through the nMOS transistors T11 T13 and T14.

The pMOS transistor T16 has a source connected to the high-potential power supply $V_{CC}$ and a drain and gate both connected to the gate of the pMOS transistor T12 and the drain of the nMOS transistor T14. Thus, the pMOS transistors T12 and T16 form a current mirror circuit. The constant current I1 that flows through the nMOS transistor T14 flows in the pMOS transistor T16, and the same constant current I1 also flows in the pMOS transistor T12.

The level-shifting power supply circuit 35 includes a pMOS transistor T17, a resistor R6 and an nMOS transistor T15. The pMOS transistor T17 has a source connected to the high-potential power supply $V_{CC}$, a drain connected to the drain of the nMOS transistor T1 and a gate connected to the drain of the pMOS transistor T16. The pMOS transistors T16 and T17 form a current mirror circuit, and the constant current I1 also flows through the pMOS transistor T17.

The nMOS transistor T15 has a source connected to the low-potential power supply $V_{SS}$, a drain connected to the drain of the pMOS transistor T5 and a gate connected to the drain of the nMOS transistor T13. The nMOS transistor T15 together with the nMOS transistor T13 form a current mirror circuit, so that the constant current I1 also flows through the nMOS transistor T15.

The resistor R6 is connected between the drain of the pMOS transistor T17 and the drain of the nMOS transistor T15. The resistor R6 serves to generate a voltage based on the constant current I1, which flows through the pMOS transistor T17 and the nMOS transistor T15.

The operational amplifier 30 of this embodiment therefore operates in the same way as the operational amplifier 10 and has the same advantages as the operational amplifier 10. According to this embodiment, the level-shifting power supply circuit 35 is comprised of the pMOS transistor 17, the nMOS transistor T15 and the resistor R6, and the constant current I1 is caused to flow across the resistor R6 by the pMOS transistor T17 and the nMOS transistor T15, thus causing a voltage drop. It is therefore possible to easily produce a given potential difference between the output signals S1 and S2 without using a power supply.

Figure 9:
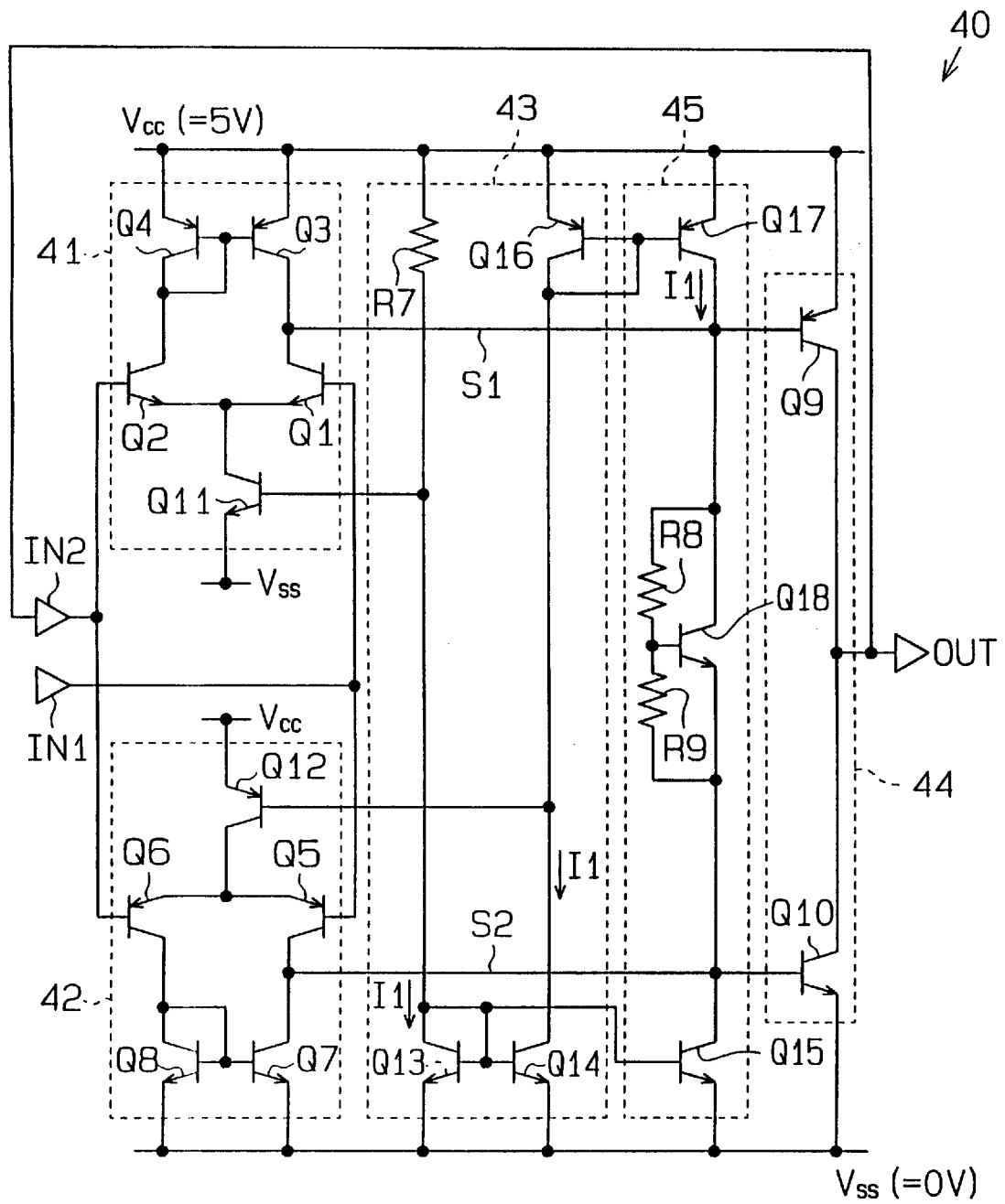
FIG. 9 is a circuit diagram of an operational amplifier according to the fourth embodiment.

The fourth embodiment of this invention will now be discussed referring to FIG. 9. An operational amplifier 40 in FIG. 9 is a voltage follower type constituted of bipolar transistors. This operational amplifier 40 comprises first and second differential amplifiers 41 and 42, a constant current circuit 43, an inverting amplifier 44 as an output circuit, and a level-shifting power supply circuit 45.

The first differential amplifier 41 has three npn transistors Q1, Q2 and Q11, and two pnp transistors Q3 and Q4. The pnp transistors Q3 and Q4 have their emitters connected to the high-potential power supply $V_{CC}$ (5 V) and their bases connected to the collector of the pnp transistor Q4. The pnp transistors Q3 and Q4 form a current mirror circuit.

The collectors of the npn transistors Q1 and Q2 are respectively connected to the collectors of the pnp transistors Q3 and Q4. The emitters of the npn transistors Q1 and Q2 are connected together to the low-potential power supply $V_{SS}$ (0 V) via the npn transistor Q11. The base of the npn transistor Q1 corresponds to a non-inverting input terminal to which an input signal IN1 is input. The base of the npn transistor Q2 corresponds to an inverting input terminal to which the output signal OUT is supplied as the input signal IN2.

The first differential amplifier 41 outputs a signal S1, which is the inverted signal of the potential difference between the first input signal IN1 and the second input signal IN2, from the collector of the npn transistor Q1. When the potential of the input signal IN1 is higher than that of the input signal IN2, more current flows in the npn transistor Q1 and less current flows in the npn transistor Q2. As a result, the potential of the output signal S1 of the differential amplifier 41 drops. When the potential of the input signal IN1 is lower than that of the input signal IN2, on the other hand, less current flows in the npn transistor Q1 and more current flows in the npn transistor Q2. Consequently, the potential of the output signal S1 of the differential amplifier 41 increases as compared with that where the potential of the input signal IN1 is higher than the potential of the input signal IN2.

The second differential amplifier 42 has three pnp transistors Q5, Q6 and Q12, and two npn transistors Q7 and Q8. The npn transistors Q7 and Q8 have their emitters connected to the low-potential power supply $V_{SS}$ (0 V) and their bases connected to the collector of the npn transistor Q8. The npn transistors Q7 and Q8 form a current mirror circuit.

The collectors of the pnp transistors Q5 and Q6 are connected to the collectors of the npn transistors Q7 and Q8, respectively. The emitters of the pnp transistors Q5 and Q6 are connected together to the high-potential power supply $V_{CC}$ (5 V) via the pnp transistor Q12. The base of the pnp transistor Q5 corresponds to a non-inverting input terminal to which an input signal IN1 is input. The base of the pnp transistor Q6 corresponds to an inverting input terminal to which the output signal OUT is supplied as the input signal IN2.

The second differential amplifier 42 outputs a signal S2, which is the inverted signal of the potential difference between the first input signal IN1 and the second input signal IN2, from the collector of the pnp transistor Q5. When the potential of the input signal IN1 is higher than that of the input signal IN2, less current flows in the pnp transistor Q5 and more current flows in the pnp transistor Q6. As a result, the potential of the output signal S2 of the differential amplifier 42 falls. When the potential of the input signal IN1 is lower than that of the input signal IN2, on the other hand, more current flows in the pnp transistor Q5 and less current flows in the npn transistor Q6. Consequently, the potential of the output signal S2 of the differential amplifier 42 increases as compared with that where the potential of the input signal IN1 is higher than the potential of the input signal IN2.

The constant current circuit 43 has a resistor R7, npn transistors Q13 and Q14 and a pnp transistor Q16. The npn transistor Q13 has a collector connected via the resistor R7 to the high-potential power supply $V_{CC}$ and an emitter connected to the low-potential power supply $V_{SS}$. The base of the npn transistor Q13 is connected to the base of the npn transistor Q11. The npn transistor Q14 has an emitter connected to the low-potential power supply $V_{SS}$ and a base connected to the base of the npn transistor Q13. Therefore, the npn transistors Q11, Q13 and Q14 form a current mirror circuit and the same constant current I1 flows through them.

The pnp transistor Q16 has an emitter connected to the high-potential power supply $V_{CC}$ and a collector and base both connected to the base of the pnp transistor Q12 and the collector of the npn transistor Q14. Therefore, the pnp transistors Q12 and Q16 form a current mirror circuit. The constant current I1, which flows through the npn transistor Q14, flows through the pnp transistor Q16. The constant current I1 also flows through the pnp transistor Q12.

The level-shifting power supply circuit 45 includes a pnp transistor Q17, resistors R8 and R9 and npn transistors Q15 and Q18. The pnp transistor Q17 has an emitter connected to the high-potential power supply $V_{CC}$, a collector connected to the collector of the npn transistor Q1, and a base connected to the collector of the pnp transistor Q16. The pnp transistors Q16 and Q17 form a current mirror circuit, and the constant current I1 also flows through the pnp transistor Q17.

The npn transistor Q15 has an emitter connected to the low-potential power supply $V_{SS}$, a collector connected to the collector of the pnp transistor Q5 and a base connected to the collector of the npn transistor Q13. The npn transistor Q15 together with the npn transistor Q13 form a current mirror circuit, and the constant current I1 also flows through the npn transistor Q15.

The npn transistor Q18 has a collector connected to the collector of the pnp transistor Q17 and an emitter connected to the collector of the npn transistor Q15. The resistor R8 is connected between the collector and base of the npn transistor Q18, and the resistor R9 is connected between the base and emitter of the npn transistor Q18. The resistor R9 serves to produce the base-emitter voltage Vbe of the npn transistor Q18 to turn on the npn transistor Q18. The current, which is obtained by dividing the base-emitter voltage Vbe by the resistance of the resistor R9, flows across the resistor R9. This current flows via the resistor R8. The resistors R8 and R9 produce a voltage of Vbe×(R8+R9)/R9 between the collector and emitter of the npn transistor Q18. The collector-emitter voltage of the npn transistor Q18 can be set as desired by arbitrarily setting the resistances of the resistor R8 and R9.

The inverting amplifier 44 is comprised of a pnp transistor Q9 and an npn transistor Q10 connected in series between the high-potential power supply circuit $V_{CC}$ (5 V) and the low-potential power supply $V_{SS}$ (0 V). The base of the pnp transistor Q9 is supplied with the output signal S1 of the first differential amplifier 41 directly or the output signal S2 of the second differential amplifier 42 via the voltage of the level-shifting power supply circuit 45. The base of the npn transistor Q10 is supplied with the output signal S2 of the second differential amplifier 42 directly or the output signal S1 of the first differential amplifier 41 via the voltage of the level-shifting power supply circuit 45. The inverting amplifier 44 sends out the signal OUT, which is obtained by amplifying the output signal S1 or S2 of the first or second differential amplifier 41 or 42 in accordance with its amplification factor (A).

In the thus constituted operational amplifier 40, the base-emitter voltages Vbe of the npn transistors Q1 and Q2 are 0.7 V, the base-emitter voltages Vbe of the pnp transistors Q5 and Q6 are –0.7 V, and voltage drops in the npn transistor Q11 and the pnp transistor Q12 are 0 V.

When 0.5 V is applied as the input signal IN1, the npn transistors Q1 and Q2 are turned off because the input voltage is smaller than the base-emitter voltage Vbe (0.7 V) of the npn transistors Q1 and Q2.

At this time, however, the pnp transistors Q5 and Q6 of the second differential amplifier 42 are turned on and the second differential amplifier 42 properly operates to output the output signal S2 of a predetermined potential based on the input signal IN1.

The potential of the output signal S1 is the potential of the output signal S2 plus the collector-emitter voltage of the npn transistor Q18. Therefore, the pnp transistor Q9 and the npn transistor Q10 are controlled based on the potentials of the output signals S1 and S2, permitting the same voltage of 0.5 V as the potential of the input signal IN1 to be output as the output signal OUT from the inverting amplifier 44.

When a voltage ranging from 1 V to 4 V is applied as the input signal IN1, the npn transistors Q1 and Q2 are turned on and the first differential amplifier 41 operates properly to send out the output signal S1 of a predetermined potential based on the input signal IN1. Further, the pnp transistors Q5 and Q6 are turned on and the second differential amplifier 42 also operates properly to send out the output signal S2 of a predetermined potential based on the input signal IN1. At this time, the potential difference between the output signals S1 and S2 is equal to the collector-emitter voltage of the npn transistor Q18. The pnp transistor Q9 and the npn transistor Q10 are controlled based on the potentials of the output signals S1 and S2, so that the same voltage as the potential of the input signal IN1 can be sent out as the amplified output signal OUT from the inverting amplifier 44.

When 4.5 V is applied as the input signal IN1, the pnp transistors Q5 and Q6 are turned off because the input voltage is greater than the difference (4.3 V) between the absolute value (5 V) of the high-potential supply voltage and the absolute value of the base-emitter voltage Vbe (−0.7 V) of the pnp transistors Q5 and Q6.

At this time, however, the npn transistors Q1 and Q2 of the first differential amplifier 41 are turned on and the first differential amplifier 41 properly operates to output the output signal S1 of a predetermined potential based on the input signal IN1. The potential of the output signal S2 therefore becomes equal to a potential obtained by subtracting the collector-emitter voltage of the npn transistor Q18 from the potential of the output signal S1. Based on the potentials of the output signals S1 and S2, the pnp transistor Q9 and the npn transistor Q10 are controlled to permit the same voltage of 4.5 V as the potential of the input signal IN1 to be output as the output signal OUT from the inverting amplifier 44. According to this embodiment, as apparent from the above, the operational amplifier can reliably operate in accordance with the input signals whose potentials lie in a wide voltage range from 0.5 V, which is close to the low-potential supply voltage to 4.5 V, which is close to the high-potential supply voltage.

In short, this embodiment is provided with the first differential amplifier 41 having the npn transistors Q1 and Q2 and the second differential amplifier 42 having the pnp transistors Q5 and Q6, so that the signal OUT can be output from the inverting amplifier 44 based on the output signal of one of those differential amplifiers. Even when the potential of the input signal IN1 is equal to or lower than the base-emitter voltage Vbe of the npn transistors Q1 and Q2, so that the first differential amplifier 41 does not operate, the second differential amplifier 42 operates properly.

Even when the potential of the input signal IN1 is greater than the difference between the absolute value of the high-potential supply voltage and the absolute value of the base-emitter voltage Vbe of the pnp transistors Q5 and Q6, so that the second differential amplifier 42 does not operate, the first differential amplifier 41 operates properly. It is therefore possible to widen the voltage range of the input signal IN1 to be substantially equal to the range from the voltage of the high-potential power supply $V_{CC}$ to the voltage of the low-potential power supply $V_{SS}$.

Further, it is likely that the base-emitter voltage Vbe of bipolar transistors varies depending on the fabrication process. According to this embodiment, however, the provision of the first and second differential amplifiers 41 and 42 eliminates the influence of that variation.

According to this embodiment, the inverting amplifier 44 is comprised of the pnp transistor Q9 connected to the high-potential power supply $V_{SS}$ and the npn transistor Q10 connected to the low-potential power supply $V_{CC}$. It is therefore possible to widen the voltage range of the output signal OUT to be substantially equal to the range from the high-potential supply voltage to the voltage of the low-potential supply voltage.

According to this embodiments a predetermined potential difference is given between the output signals S1 and S2 by connecting the level-shifting power supply circuit 45 between the output signal S1 of the first differential amplifier 41 and the output signal S2 of the second differential amplifier 42. This improves the linearity of the outputs of the pnp transistor Q9 and the npn transistor Q10 of the inverting amplifier 44.

It should be apparent to those skilled in the art that the present invention may be embodied in many other specific forms without departing from the spirit or scope of the invention. Particularly, it should be understood that this invention may be modified in the following forms.

The level-shifting power supply circuit 25 in the second embodiment may be replaced with a Zener diode or a resistor. This modification also has the same advantages as those of the second embodiment.

This invention may of course be adapted to, instead of a voltage follower type operational amplifier, a non-inverting amplifier, that is, an operational amplifier whose output terminal is connected to its non-inverting input terminal (positive input terminal), so that the output signal OUT is applied as the input signal IN1, or an operational amplifier that is designed not to feed back the output signal.

I claim:

1. An operational amplifier having a high voltage power supply and a low voltage power supply, wherein the operational amplifier receives first and second input signals and amplifiers a voltage difference between the first and second input signals to generate an amplified signal, the operational amplifier comprising:

a first differential amplifier having a pair of first type transistors that are activated by the first and second input signals having a voltage greater than the voltage of the low voltage power supply, wherein the first differential amplifier transmits a first output signal in response to the voltage difference between the first and second input signals;

a second differential amplifier having a pair of second type transistors that are activated by the first and second input signals having a voltage smaller than the voltage of the high voltage power supply, wherein the second differential amplifier transmits a second output signal in response to the voltage difference between the first and the second input signals, wherein when one of the transistor pairs of the first and second differential amplifiers is activated, the other is not activated;

a level shift power supply receiving the first and second output signals and generating a synthesized signal that has a predetermined voltage difference between the first and second output signals; and an output circuit activated by the synthesized signal to generate said amplified signal.

2. The operational amplifier according to claim 1, wherein the output circuit has first and second transistors connected in series between the high voltage power supply and the low voltage power supply, wherein the first and second transistors receive the synthesized signal.

3. The operational amplifier according to claim 2, wherein the first transistor is a pMOS transistor and the second transistor is an nMOS transistor.

4. The operational amplifier according to claim 2, wherein the first transistor is a pnp transistor and the second transistor is an npn transistor.

5. The operational amplifier according to claim 2, wherein the first type transistors of the first differential amplifier are nMOS transistors and the second type transistors of the second differential amplifier are pMOS transistors.

6. The operational amplifier according to claim 2, wherein the first type transistors of the first differential amplifier are npn transistors and the second type transistors of the second differential amplifier are pnp transistors.

7. An operational amplifier having a high voltage power supply and a low voltage power supply, wherein the operational amplifier receives first and second input signals and amplifies a voltage difference between the first and second input signals to generate an amplified signal, the operational amplifier comprising:

a first differential amplifier having a pair of first type transistors that are activated by the first and second input signals having a voltage greater than the voltage of the low voltage power supply, wherein the first differential amplifier transmits a first output signal in response to the voltage difference between the first and second input signals;

a second differential amplifier having a pair of second type transistors that are activated by the first and second input signals having a voltage smaller than the voltage of the high voltage power supply, wherein the second differential amplifier transmits a second output signal in response to the voltage difference between the first and second input signals;

a level shift power supply receiving the first and second output signals and generating a synthesized signal, wherein the level shift power supply includes a battery connected between the first output signal and the second output signal; and an output circuit activated by the synthesized signal to generate said amplified signal.

8. An operational amplifier having a high voltage power supply and a low voltage power supply, wherein the operational amplifier receives first and second input signals and amplifies a voltage difference between the first and second input signals to generate an amplified signal, the operational amplifier comprising:

a first differential amplifier having a pair of first type transistors that are activated by the first and second input signals having a voltage greater than the voltage of the low voltage power supply, wherein the first differential amplifier transmits a first output signal in response to the voltage difference between the first and second input signals;

a second differential amplifier having a pair of second type transistors that are activated by the first and second input signals having a voltage smaller than the voltage of the high voltage power supply, wherein the second differential amplifier transmits a second output signal in response to the voltage difference between the first and second input signals;

a level shift power supply receiving the first and second output signals and generating a synthesized signal, wherein the level shift power supply includes a diode connected between the first output signal and the second output signal; and an output circuit activated by the synthesized signal to generate said amplified signal.

9. An operational amplifier having a high voltage power supply and a low voltage power supply, wherein the operational amplifier receives first and second input signals and amplifies a voltage difference between the first and second input signals to generate an amplified signal, the operational amplifier comprising:

a first differential amplifier having a pair of first type transistors that are activated by the first and second input signals having a voltage greater than the voltage of the low voltage power supply, wherein the first differential amplifier transmits a first output signal in response to the voltage difference between the first and second input signals;

a second differential amplifier having a pair of second type transistors that are activated by the first and second input signals having a voltage smaller than the voltage of the high voltage power supply, wherein the second differential amplifier transmits a second output signal in response to the voltage difference between the first and second input signals;

a level shift power supply receiving the first and second output signals and generating a synthesized signal, wherein the level shift power supply includes a first resistor connected between the first output signal and the second output signal, the first resistor having a first end connected to the high voltage power supply by means of a first constant-current supply and a second end connected to the low voltage power supply by means of a second constant-current supply; and an output circuit activated by the synthesized signal to generate said amplified signal.

10. An operational amplifier having a high voltage power supply and a low voltage power supply, wherein the operational amplifier receives first and second input signals and amplifies a voltage difference between the first and second input signals to generate an amplified signal, the operational amplifier comprising:

a first differential amplifier having a pair of first type transistors that are activated by the first and second input signals having a voltage greater than the voltage of the low voltage power supply, wherein the first differential amplifier transmits a first output signal in response to the voltage difference between the first and second input signals;

a second differential amplifier having a pair of second type transistors that are activated by the first and second input signals having a voltage smaller than the voltage of the high voltage power supply, wherein the second differential amplifier transmits a second output signal in response to the voltage difference between the first and second input signals;

a level shift power supply receiving the first and second output signals and generating a synthesized signal, wherein the level shift power supply includes:

a bipolar transistor having a collector, an emitter and a base, the collector and the emitter being connected between the first output signal and the second output signal;

a first resistor connected between the collector and the base of the bipolar transistor; and a second resistor connected between the base and the emitter of the bipolar transistor;

wherein the collector of the bipolar transistor is connected to the high voltage power supply by means of a first constant-current supply and the emitter of the bipolar transistor is connected to the low voltage power supply by means of a second constant-current supply; and an output circuit activated by the synthesized signal to generate said amplified signal.

11. The operational amplifier according to claim 1, wherein the amplified signal is used as the second input signal.

* * * * *